United States Patent [19]

Shirota et al.

[11] Patent Number: 5,519,246

[45] Date of Patent: May 21, 1996

[54] NONVOLATILE MEMORY APPARATUS USING AN ULTRAVIOLET IMPERMEABLE RESIN FILM

[75] Inventors: Syouzo Shirota; Takahiro Ootuka, both of Hyogo, Japan

[73] Assignee: Mitsubishi Denki Kabushiki Kaisha, Tokyo, Japan

[21] Appl. No.: 503,258

[22] Filed: Jul. 17, 1995

Related U.S. Application Data

[63] Continuation of Ser. No. 255,535, Jun. 3, 1994, abandoned, which is a continuation of Ser. No. 21,422, Feb. 23, 1993, Pat. No. 5,367,090.

[30] Foreign Application Priority Data

Feb. 28, 1992 [JP] Japan ..................... 4-043060

[51] Int. Cl.$^6$ .................................... H01L 29/78
[52] U.S. Cl. .................. 257/435; 257/659; 257/643; 365/53; 365/185.04
[58] Field of Search ................. 257/435, 659, 257/660, 323, 643; 365/185, 218

[56] References Cited

U.S. PATENT DOCUMENTS

| | | | |
|---|---|---|---|
| 4,758,869 | 7/1988 | Eitan et al. | 257/323 |
| 4,847,667 | 7/1989 | Mori | 357/23.5 |
| 5,068,697 | 11/1991 | Noda et al. | 257/659 |

FOREIGN PATENT DOCUMENTS

| | | | |
|---|---|---|---|
| 0227549 | 12/1986 | European Pat. Off. | H01L 29/78 |
| 0433174 | 12/1990 | European Pat. Off. | H01L 23/552 |
| 63-138734 | 6/1988 | Japan . | |
| 01145869 | 6/1989 | Japan . | |
| 01313058 | 12/1989 | Japan . | |
| 0249451 | 2/1990 | Japan . | |

OTHER PUBLICATIONS

"Understanding IC Lithography," David H. Ziger, *IEEE Circuits and Devices Magazine*, IEEE, Sep. 1992.

"Advanced 'Contact Engineering' for Submicron VLSI Multilevel Metallization," K. Konrad Young, et al., *IEEE Transactions on Semiconductor Manufacturing*, vol. 6, No. 1, Feb. 1993.

*Primary Examiner*—David C. Nelms
*Assistant Examiner*—Vu A. Le
*Attorney, Agent, or Firm*—Townsend and Townsend and Crew

[57] ABSTRACT

In a nonvolatile memory apparatus having a special information memory cell, which keeps special information undesirable to be erased at the time of illumination of an ultraviolet ray, in addition to an ultraviolet-erasable memory cell mainframe, an ultraviolet impermeability resin film having an electrically insulating characteristic is provided on the special information memory cell so as to guard the information of the portion, covered by the ultraviolet impermeability resin film, at the time of the illumination of an ultraviolet ray. Since the ultraviolet impermeability resin film has an electrically insulating characteristic, it is possible to widely cover the special information memory cell to prevent the ultraviolet ray from passing around the ultraviolet impermeability resin film without a restriction on a wiring pattern formation, thereby improving the reliability.

9 Claims, 3 Drawing Sheets

5,519,246

NONVOLATILE MEMORY APPARATUS USING AN ULTRAVIOLET IMPERMEABLE RESIN FILM

This is a continuation of application Ser. No. 08/255,535, filed Jun. 3, 1994, now abandoned which is continuation of application Ser. No. 08/021,422 now U.S. Pat. No. 5,367,090, filed Feb. 23, 1994.

BACKGROUND OF THE INVENTION

1. Field of the Invention

The present invention relates to an ultraviolet-erasable nonvolatile memory apparatus (EPROM: Erasable Programmable Read Only Memory), and more particularly to a nonvolatile memory having a special information memory cell for keeping special information, which is undesirable to be erased at the time of illumination of an ultraviolet ray, in addition to having an ultraviolet-erasable memory cell mainframe.

2. Description of the Prior Art

FIG. 4 is a cross-sectional view showing an arrangement of a special information memory cell of such a conventional nonvolatile memory apparatus. In the illustration, numeral 2 represents an aluminium (Al) coat provided in order to prevent the transmission of an ultraviolet ray and 3 designates a passivation film for protecting a wiring pattern, the Al coat 2 and others from being insulated or rusted. Further, numerals 4 to 9 are components of the memory cell, 4 denoting an oxide film, 5 depicting a control gate, 6 designating a floating gate, 7 indicating an $n^+$ source (or $n^+$ drain), 8 designating an $n^+$ drain (or $n^+$ source) and 9 being a P-type silicon substrate. Here, the wiring pattern is formed on the oxide film 4.

In operation, in FIG. 4, when ultraviolet illumination is effected in order to erase the information of the memory cell main frame, not shown, of the EPROM, the special information memory cell shown, i.e., the memory cell of the EPROM portion (UPROM: Unerasable PROM) undesirable to erase the information, is covered by the Al coat 2 to prevent the transmission of the ultraviolet ray, thereby preventing the erasure of the information of the memory cell comprising the oxide film 4, control gate 5, floating gate 6, $n^+$ source (or $n^+$ drain) 7, $n^+$ drain (or $n^+$ source) 8 and P-type silicon substrate 9. Here, the special information unerasable irrespective of the ultraviolet illumination is used for the wafer test and others in a semiconductor memory manufacturing process, for example, is laser trimming information, test information, wafer history information or the like.

Since such a conventional nonvolatile memory apparatus is constructed as described above, for preventing the short-circuit to the wiring pattern, there is a problem that it is necessary to sufficiently provide a space around the Al coat 2 so as to restrict the formation of the wiring pattern. Further, if reducing the area of the Al coat 2 to soften the restriction on the formation of the wiring pattern, the ultraviolet ray radiated can pass around the Al coat 2 to reach the memory cell, thereby making the operation unstable and lowering the reliability.

SUMMARY OF THE INVENTION

The present invention has been developed in order to eliminate the above-described problems, and it is therefore an object of this invention to provide a nonvolatile memory apparatus which is capable of removing the restriction on the formation of the wiring pattern to improve the reliability after the ultraviolet illumination.

According to this invention, in a nonvolatile memory apparatus having a special information memory cell, which is for keeping special information undesirable to be erased by the ultraviolet illumination, in addition to an ultraviolet-erasable memory cell mainframe, an ultraviolet impermeability resin film having an electrically insulating characteristic is provided on the special information memory cell so as to guard the information in a portion, covered by the ultraviolet impermeability resin film, at the time of the ultraviolet illumination. Since the ultraviolet impermeability resin film has an electrically insulating characteristic, it is possible to widely cover the special information memory cell to prevent the ultraviolet ray from passing around the resin film and directing toward the memory cell without the restriction on the formation of the wiring pattern.

The above and other objects, features, and advantages of the Invention will become more apparent from the following description when taken in conjunction with the accompanying drawings.

DESCRIPTION OF THE PREFERRED EMBODIMENT

Embodiment 1

Figure 1:
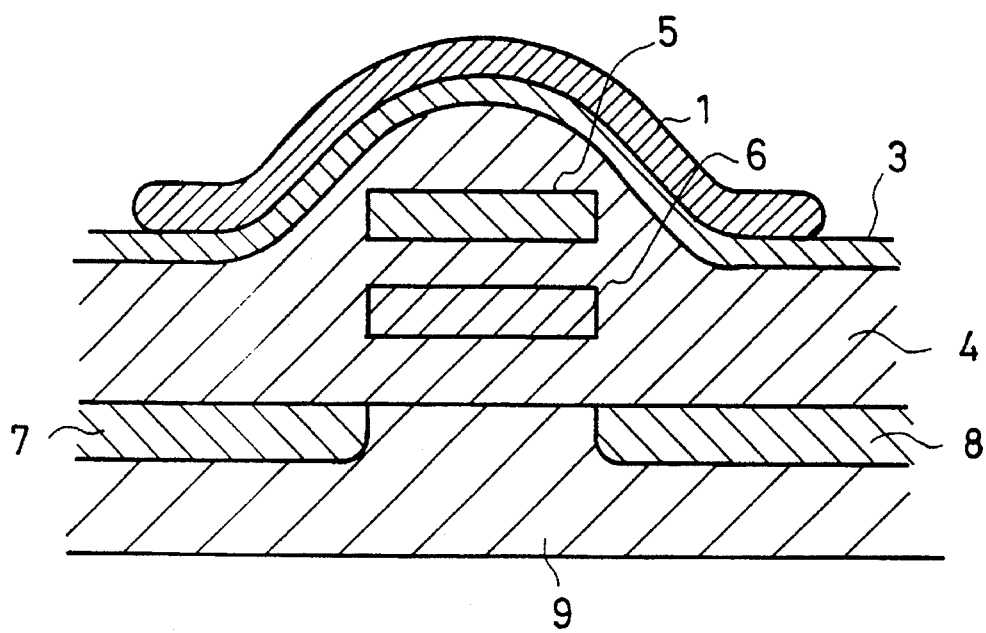
FIG. 1 is a cross-sectional view showing a principal portion of a nonvolatile memory apparatus according to a a first embodiment of the present invention.
Figures 2A, 2B, 2C, 2D:
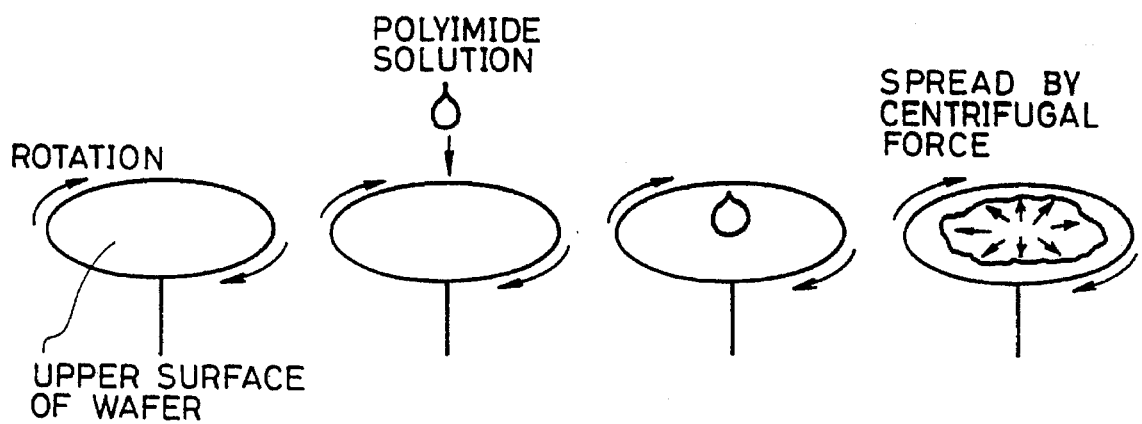
FIGS. 2A to 2D are illustrations for formation of a polyimide film in accordance with the spin coating technique in the embodiment.

A first embodiment of this invention will be described hereinbelow. FIG. 1 is a cross-sectional view showing an arrangement of a special information memory cell of a nonvolatile memory apparatus according to the first embodiment of this invention. In the illustration, numeral 1 represents a polyimide coat film (polyimide film) which acts as the ultraviolet impermeability resin film having an electrically insulating characteristic and which is provided in place of the conventional Al coat 2. As the polyimide coat film there can be used the PIX (trade name of Hitachi Kasei Co., Ltd.) which is currently used as a buffer coat to be provided between a semiconductor chip and a package thereof to prevent occurrence of cracking due to the difference in expansion coefficient between the chip and package. Parts 3 to 9 are similar to those in the conventional memory apparatus. That is, numerals 3 designates a passivation film, 4 denotes an oxide film, 5 depicts a control gate, 6 represents a floating gate, 7 indicates an $n^+$ source (or $n^+$ drain), 8 designates an $n^+$ drain (or $n^+$ source) and 9 is a P-type silicon substrate. Here, because of having an electrically insulating characteristic and being not rusted, the polyimide coat film 1 can widely be formed on the passivation film 3 so as to sufficiently cover the above-mentioned memory cell. In addition, polyimide can cut light having a wavelength below 400 nm if having a film thickness which is 1 μm or more and the wavelength of the ultraviolet ray is about 150 nm to 300 nm. Thus, for offering the ultraviolet blocking effect, the thickness of the polyimide coat film 1 is arranged to be above 1 μm, preferably 2 μm to 15 μm.

The polyimide coat film 1 can be formed, for example, in accordance with the spin coat technique or potting technique. FIGS. 2A to 2D are schematic illustrations for describing the formation according to the spin coat technique. As illustrated in FIGS. 2A to 2D, in the state that a wafer having a memory cell is rotating, a polyimide solution is dropped at the rotating center portion of the upper surface of the wafer so as to be spread on the wafer upper surface by means of a centrifugal force due to the rotation to coat the wafer upper surface. The unnecessary portion on the wafer is removed. On the other hand, in the case of the potting, the polyimide solution is applied onto the wafer upper surface to coat a necessary portion only.

An operation will be described hereinbelow with reference to FIG. 1. Now, it it is assumed that ultraviolet ray is radiated in order to erase the information of the memory cell mainframe (not shown) of the EPROM. Since the memory cell of the EPROM portion (UPROM portion) undesirable to erase the information is sufficiently covered by the polyimide coat film 1, which does not transmit the ultraviolet ray, so as to prevent the ultraviolet ray from transmitting and passing around the polyimide coat film 1, the ultraviolet ray cannot reach the memory cell comprising the oxide film 4, control gate 5, floating gate 6, $n^+$ source (or $n^+$ drain) 7, $n^+$ drain (or $n^+$source) 8 and P-type silicon substrate 9, thereby preventing the erasure of the information of the memory cell.

Embodiment 2

Figure 3:
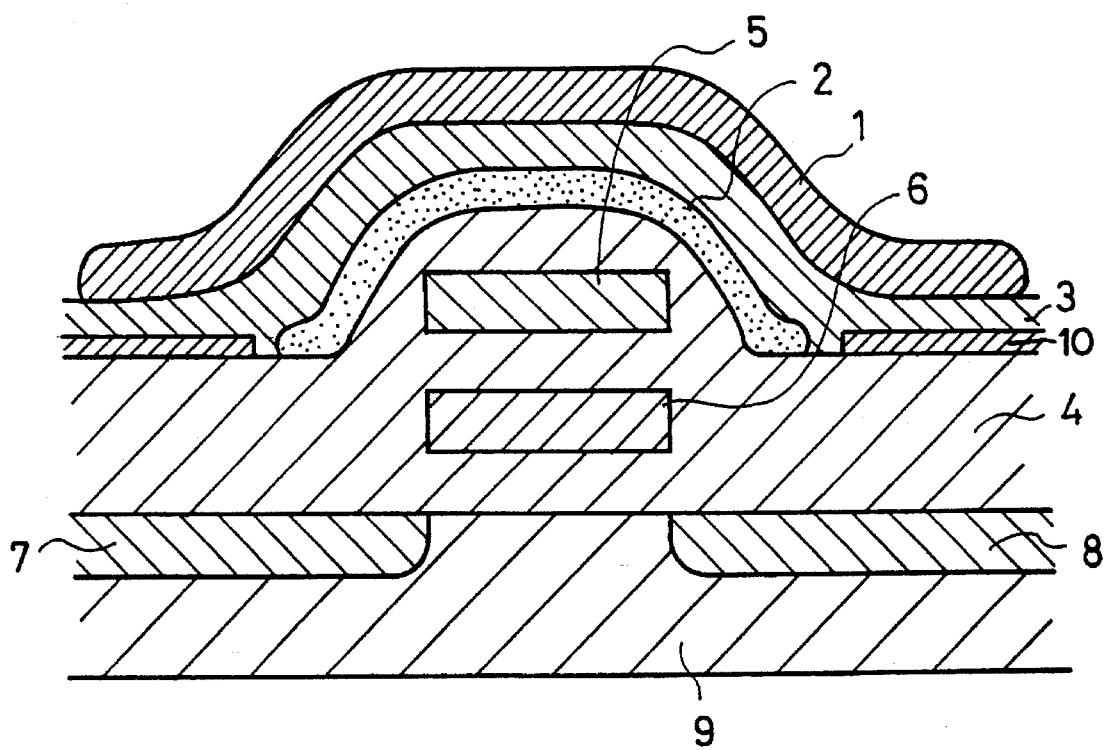
FIG. 3 is a cross-sectional view showing a principal portion of a nonvolatile memory apparatus according to a second embodiment of this invention.
Figure 4:
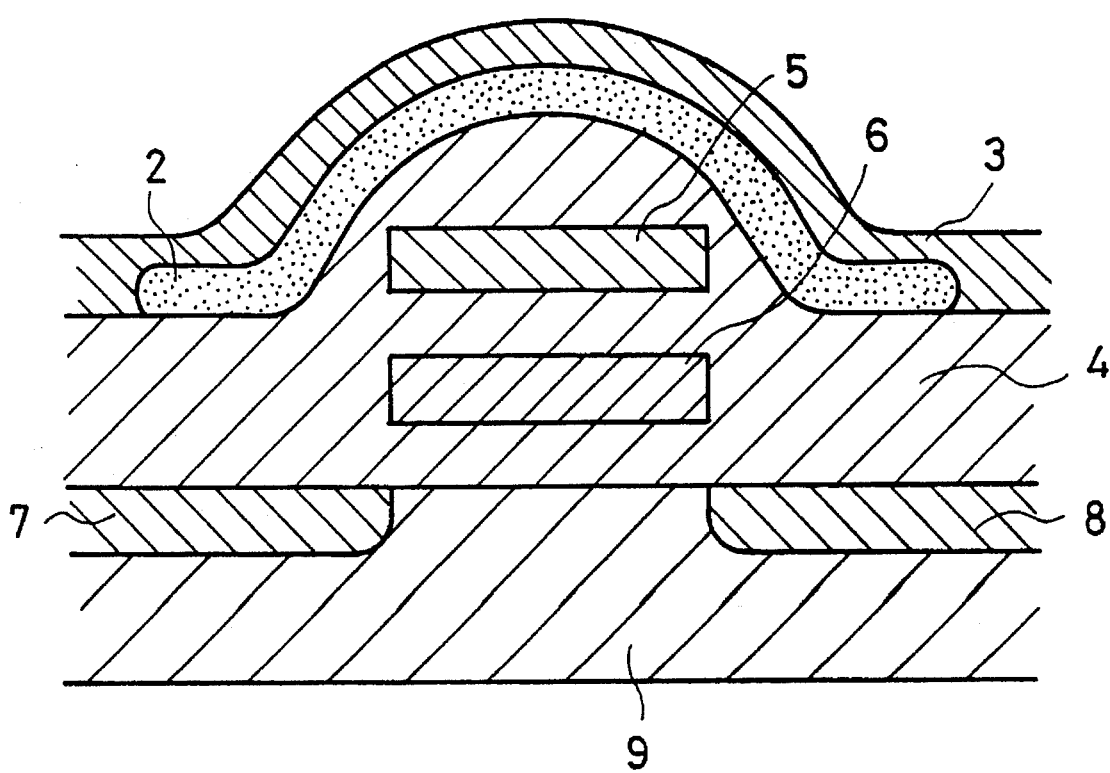
FIG. 4 is a cross-sectional view showing a principal portion of a conventional nonvolatile memory apparatus.

FIG. 3 is a cross-sectional view showing an arrangement of a special information memory cell of a nonvolatile memory apparatus according to a second embodiment of this invention. As illustrated in FIG. 3, the memory cell comprising an oxide film 4 to a P-type silicon substrate 9 is covered by an Al coat 2 and further the Al coat 2 is covered by a polyimide coat film 1 (similar to the polyimide coat film in the above-described first embodiment) with a passivation film 3 being interposed between the Al coat 2 and the polyimide coat film 1. In this case, as clear by the comparison with the conventional example shown in FIG. 4, the Al coat 2 is formed to have as small area as possible so as not to make a large restriction on the wiring pattern formation 10. With this arrangement, it is possible to further heighten the reliability of the nonvolatile memory apparatus.

Although in the above-described first and second embodiments the polyimide coat film 1 is used as the ultraviolet impermeability resin film having an electrically insulating characteristic, it is appropriate to use a different resin film if having the ultraviolet impermeability and the electrically insulating characteristic. In addition, although in the above-described first and second embodiments the polyimide coat film 1 is provided on the upper surface of the passivation film 3, it is also appropriate that the polyimide coat film 1 is provided at the lower side of the passivation film 3, i.e., on the upper surface of the oxide film 4 in which the wiring pattern is formed, because the polyimide coat film 1 has an electrically insulating characteristic.

As described above, according to this invention, the memory cell is arranged to be covered by the ultraviolet impermeability resin film so as to keep the special information undesirable to be erased at the time of the ultraviolet illumination, it is possible to widely cover the memory cell without the restriction on the wiring pattern formation, thereby improving the reliability of the operation after the illumination of the ultraviolet ray.

What is claimed is:

1. A nonvolatile memory apparatus having a substrate and a special information memory cell which stores special information and includes a source conductor and a drain conductor formed on the substrate, an oxide film formed on the substrate and a gate formed within the oxide film, the oxide film having a rising portion corresponding to an upper part of the gate, said memory apparatus comprising:

an aluminum coating film overlying the upper surface of the rising portion of the oxide film; and an ultraviolet impermeable resin film overlying said aluminum coating film so that when said nonvolatile memory apparatus is illuminated from above by an ultraviolet ray said ultraviolet impermeable resin film prevents the ultraviolet ray from reaching the special information memory cell; and a wiring pattern formed on the oxide film adjacent to the rising portion.

2. A nonvolatile memory apparatus as claimed in claim 1, wherein a polyimide coat film is used as said ultraviolet impermeability resin film.

3. A nonvolatile memory apparatus as claimed in claim 2, wherein said polyimide coat film has a thickness above 1 μm.

4. A nonvolatile memory apparatus as claimed in claim 2, wherein the thickness of said polyimide coat film is 2 μm to 15 μm.

5. A nonvolatile memory apparatus as claimed in claim 1, wherein the ultraviolet ray has a wavelength between 150 to 300 nanometers and wherein the thickness of the impermeable resin film is at least one micrometer.

6. A nonvolatile memory apparatus as claimed in claim 5, wherein the thickness of the impermeable resin film is between 2 to 15 micrometers.

7. A nonvolatile memory apparatus including a substrate and a special information cell, wherein the special information cell stores special information and includes a source conductor, a drain conductor formed on the substrate, an oxide film formed on the substrate and a gate formed within the oxide film, wherein said oxide film comprises a rising portion corresponding to an upper part of said gate and a flat portion extending horizontally from said rising portion, said nonvolatile memory apparatus comprising:

an aluminum coating film which is formed to overlie the upper surface of the rising portion of the oxide film and is formed such that an end portion of said aluminum coating film is positioned near the boundary of said rising portion and said flat portion; and an ultraviolet impermeable resin film overlying said aluminum coating film so that when said nonvolatile memory apparatus is illuminated from above by an ultraviolet ray said ultraviolet impermeable resin film prevents the ultraviolet ray from reaching the special information cell.

8. A nonvolatile memory apparatus as claimed in claim 7, wherein the ultraviolet ray has a wavelength between 150 to 300 nanometers and wherein the thickness of the impermeable resin film is at least one micrometer.

9. A nonvolatile memory apparatus as claimed in claim 7, wherein the thickness of the impermeable resin film is between 2 to 15 micrometers.

* * * * *